(12) United States Patent
Song

(10) Patent No.: US 6,541,332 B2
(45) Date of Patent: Apr. 1, 2003

(54) METHOD FOR FABRICATING CAPACITOR CONTAINING ZIRCONIUM OXIDE DIELECTRIC LAYER

(75) Inventor: Chang-Rock Song, Kyoungki-do (KR)

(73) Assignee: Hynix Semiconductor Inc, Gyunggi-Do (KR)

( * ) Notice: Subject to any disclaimer, the term of this patent is extended or adjusted under 35 U.S.C. 154(b) by 0 days.

(21) Appl. No.: 10/146,121

(22) Filed: May 15, 2002

(65) Prior Publication Data

US 2003/0003650 A1 Jan. 2, 2003

(30) Foreign Application Priority Data

Jun. 30, 2001 (KR) .............................. 01-38645

(51) Int. Cl.$^7$ ......................................... H01L 21/8242
(52) U.S. Cl. ..................... 438/240; 438/253; 438/381
(58) Field of Search ............................ 438/3, 238–240, 438/253–256, 381, 393–399

(56) References Cited

U.S. PATENT DOCUMENTS

| | | | |
|---|---|---|---|
| 5,338,951 A | 8/1994 | Argos, Jr. et al. | .......... 257/295 |
| 5,641,702 A | 6/1997 | Imai et al. | .......... 438/396 |
| 5,907,780 A | 5/1999 | Gilmer et al. | .......... 438/299 |
| 6,072,689 A | * 6/2000 | Kirlin | .......... 361/311 |
| 6,235,594 B1 | 5/2001 | Merchant et al. | .......... 438/287 |

* cited by examiner

Primary Examiner—Jey Tsai
(74) Attorney, Agent, or Firm—Marshall, Gerstein & Borun

(57) ABSTRACT

The disclosure relates to a method for fabricating a capacitor that prevents a rise in the production cost and complexity of production processes caused by performing deposition and subsequent treatment thereof whenever a layer is formed. The disclosure provides a method for fabricating a capacitor, including the steps of: forming a $Ti_{1-x}Zr_xN$ layer on a substrate, wherein x is in the range of 0 to 0.5, inclusive; forming an electrode layer on the $Ti_{1-x}Zr_xN$ layer; and forming a $ZrO_2$ layer on an interface between the electrode layer and the $Ti_{1-x}Zr_xN$ layer by performing a thermal treatment in an atmosphere containing oxygen gas, whereby a capacitor having a bottom electrode formed with the $Ti_{1-x}Zr_xN$ layer, a dielectric layer formed with the $ZrO_2$ layer, and a top electrode formed with the electrode layer is fabricated.

17 Claims, 5 Drawing Sheets

METHOD FOR FABRICATING CAPACITOR CONTAINING ZIRCONIUM OXIDE DIELECTRIC LAYER

BACKGROUND OF THE DISCLOSURE

1. Field of the Disclosure

The disclosure relates to a method for fabricating a semiconductor device; and, more particularly, to a method for fabricating a capacitor.

2. Description of Related Art

As integration of semiconductor devices has increased, studies have been conducted to increase the charge storage area by forming a capacitor in complicated structures such as cylinders, fins, stacks and hemispheric silicon (HSG), to secure sufficient capacitance. In addition, a dielectric layer of capacitor is formed of materials such as $ZrO_2$, $Al_2O_3$, $Ta_2O_5$, $SrTiO_3$, $(Ba,Sr)TiO_3$, BLT, etc, which have dielectric constants that are higher than $SiO_2$ or $Si_3N_4$. In particular, $ZrO_2$ layer is a high dielectric layer currently studied for a dielectric layer of a capacitor.

FIGS. 1A to 1C are cross-sectional views illustrating a conventional method for fabricating a capacitor.

Referring to FIG. 1A, an interlayer dielectric layer (ILD) 12 is formed on a semiconductor substrate 11 having transistors and bit lines, and a storage node contact mask (not shown) is formed on interlayer dielectric layer (ILD) 12. After that, a storage node contact hole is formed to expose a predetermined area of the surface of the semiconductor substrate 11 by etching the interlayer dielectric layer 12 with the storage node contact mask.

Subsequently, a polysilicon layer is formed on the entire surface including the storage node contact hole, and then an etch back process is carried out in order to form a polysilicon plug 13 in the contact hole to a predetermined depth.

After that, a titanium silicide ($TiSi_2$) 14 and a titanium nitride (TiN) layer 15 are formed on the polysilicon plug 13. The $TiSi_2$ 14 forms an ohmic contact with a following bottom electrode, and the TiN layer serves as an anti-diffusion layer that prevents oxygen remaining inside the bottom electrode from diffusing into the polysilicon plug 13, the storage node contact plug, or into the semiconductor substrate 11.

Referring to FIG. 1B, a sacrificial oxide layer 16 that determines the height of the bottom electrode is formed on the interlayer dielectric layer 12 and the TiN layer 15, and then a storage node mask (not shown) using a photoresist is formed on the sacrificial oxide layer 16.

Subsequently, the sacrificial oxide layer 16 is selectively etched with the storage node mask to form an opening in which a bottom electrode is aligned with the polysilicon plug 13 to be formed.

Thereafter, a bottom electrode 17 is formed of metal over the surface of the sacrificial oxide layer 16 including the opening. After that, the bottom electrode is made to remain in the opening only through the process of etch-back or chemical mechanical polishing method so that the bottom electrode in the concavity is isolated from the neighboring bottom electrodes.

Referring to FIG. 1C, on the entire surface including the bottom electrode 17, a dielectric layer 18 and a top electrode 19 are formed successively. Here, the bottom electrode 17, dielectric layer 18 and top electrode 19 are formed by a chemical vapor deposition (CVD) method, and the dielectric layer 18 is mostly made of a high dielectric layer such as $ZrO_2$.

In the conventional method described above, a capacitor is formed connected to a plug by using a storage node contact mask.

However, in a dynamic RAM (DRAM) over 4 Gbits that a fine design rule should be applied to, the storage node contact plug and the bottom electrode should not be misaligned. Also, to secure a sufficient capacitance, the height of the bottom electrode should be increased, but there is a difficulty because the plug height for interconnection becomes greater as the height of the bottom electrode increases. In addition, because the isolation gap from the neighboring bottom electrode reduces, the current technology for forming a bottom electrode, dielectric layer and top electrode by the CVD method has reached its limitation, so an atomic layer deposition (ALD) method is under development recently.

However, the ALD method has a shortcoming in that an extra thermal treatment, or plasma treatment should be performed in every step to improve the quality of the layers. This is because the ALD method conducts depositions at a low temperature to improve the step coverage. Therefore, the production cost rises when one uses the ALD method due to complicated processes and the investment required for new equipment.

SUMMARY OF THE DISCLOSURE

In one aspect, the disclosure provides a method for fabricating a capacitor that prevents a rise in the production cost and complexity in production processes caused by performing a deposition and a subsequent treatment thereof whenever a layer is formed.

In another aspect, the disclosure provides a method for fabricating a capacitor that prevents a misalignment in masking or etching processes for connecting transistors and the capacitor.

In accordance with an aspect of the disclosure, a method for fabricating a capacitor comprises the steps of: forming a $Ti_{1-x}Zr_xN$ layer on a substrate, wherein x is in the range of 0 to 0.5, inclusive; forming an electrode layer on the $Ti_{1-x}Zr_xN$ layer; and forming a $ZrO_2$ layer on an interface between the electrode layer and the $Ti_{1-x}Zr_xN$ layer by performing a thermal treatment in an atmosphere containing oxygen gas, whereby a capacitor including a bottom electrode formed with the $Ti_{1-x}Zr_xN$ layer, a dielectric layer formed with the $ZrO_2$ layer, and a top electrode formed with the electrode layer is fabricated.

In accordance with another aspect of the disclosure, a method for fabricating a capacitor comprises the steps of: forming an interlayer dielectric layer on a silicon semiconductor substrate; forming a contact hole that exposes a surface of the semiconductor substrate by selectively etching the interlayer dielectric layer; forming a $Ti_{1-x}Zr_xN$ layer in the contact hole, wherein x is in the range of 0 to 0.5, inclusive; forming an electrode layer on the $Ti_{1-x}Zr_xN$ layer; and forming a $ZrO_2$ layer on an interface between the electrode layer and the $Ti_{1-x}Zr_xN$ layer by performing a thermal treatment in an atmosphere containing oxygen gas, whereby a capacitor including a bottom electrode formed with the $Ti_{1-x}Zr_xN$ layer, a dielectric layer formed with the $ZrO_2$ layer, and a top electrode formed with the electrode layer is fabricated.

BRIEF DESCRIPTION OF THE DRAWINGS

The above and other aspects and features of the disclosure will become apparent from the following description of the preferred embodiments given in conjunction with the accompanying drawings, in which.

DETAILED DESCRIPTION OF THE DISCLOSURE

Other aspects and features of the disclosure will become apparent from the following description with reference to the accompanying drawings.

Figure 1A:
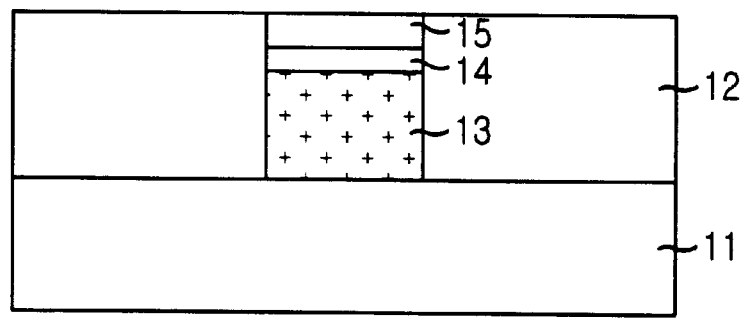
FIGS. 1A to 1C are cross-sectional views illustrating a conventional method for fabricating a capacitor.
Figure 1B:
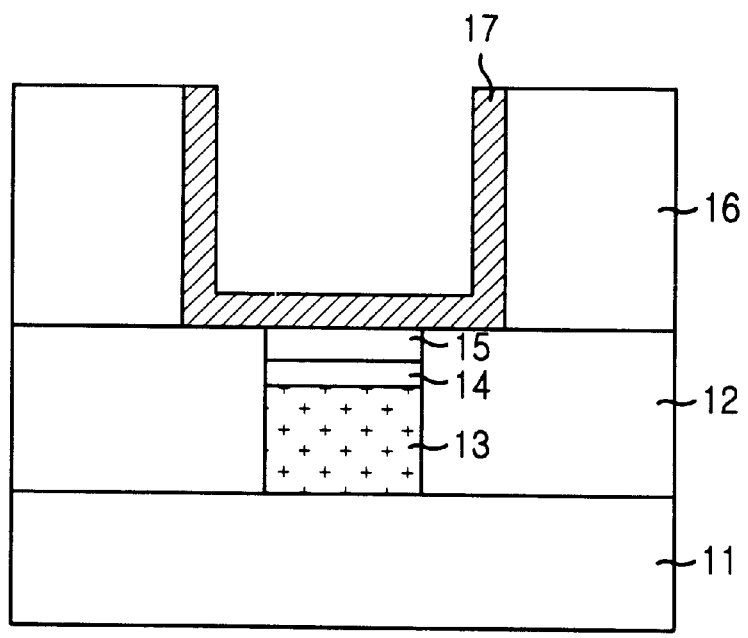
Figure 1C:
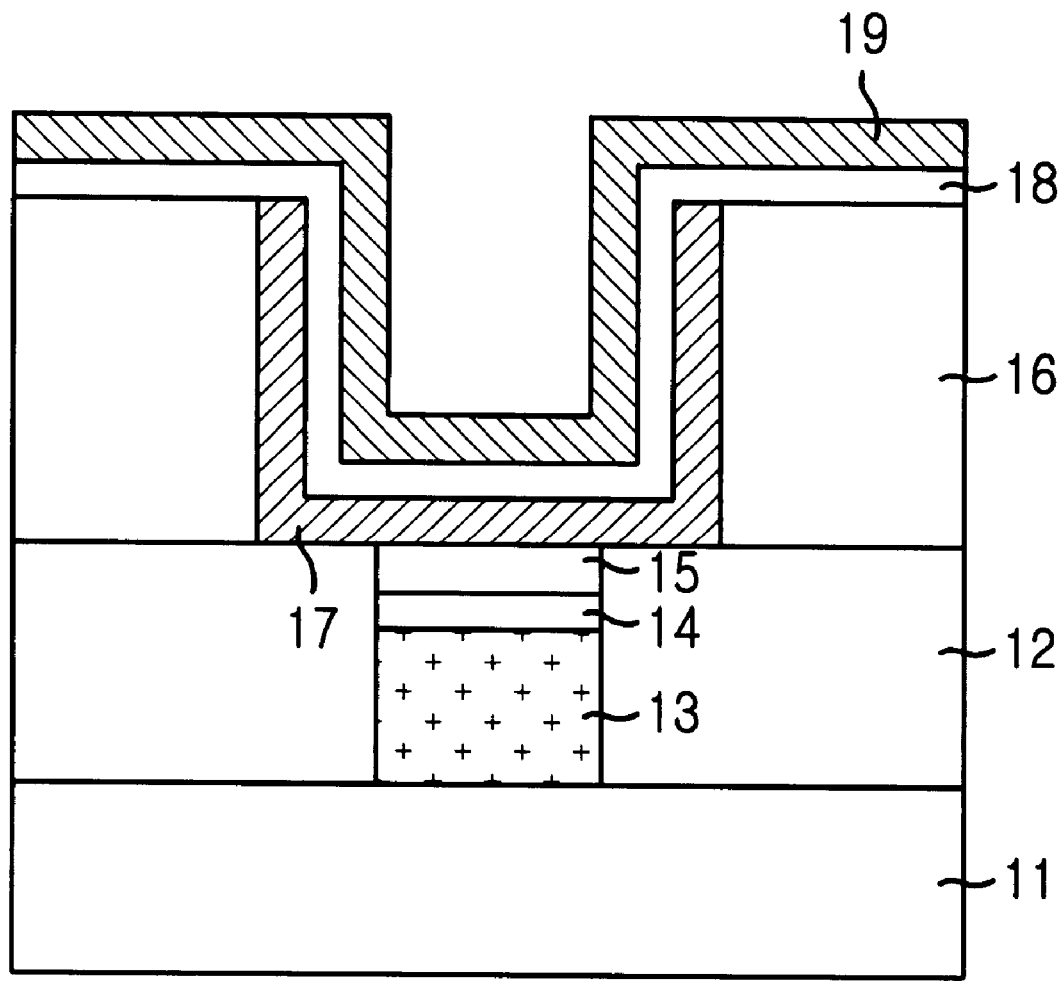
Figure 2A:
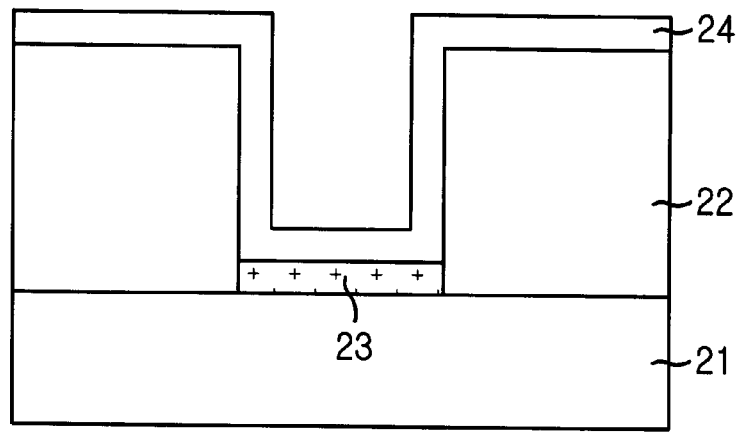
FIGS. 2A to 2C are cross-sectional views depicting a method for fabricating a capacitor in accordance with an aspect of the disclosure.
Figure 2B:
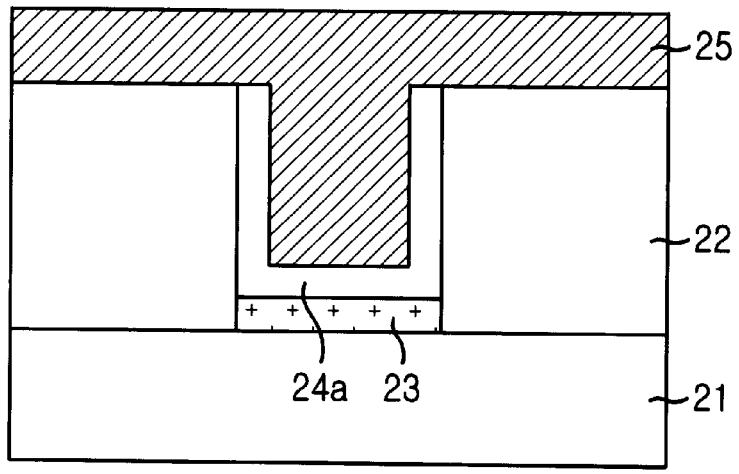
Figure 2C:
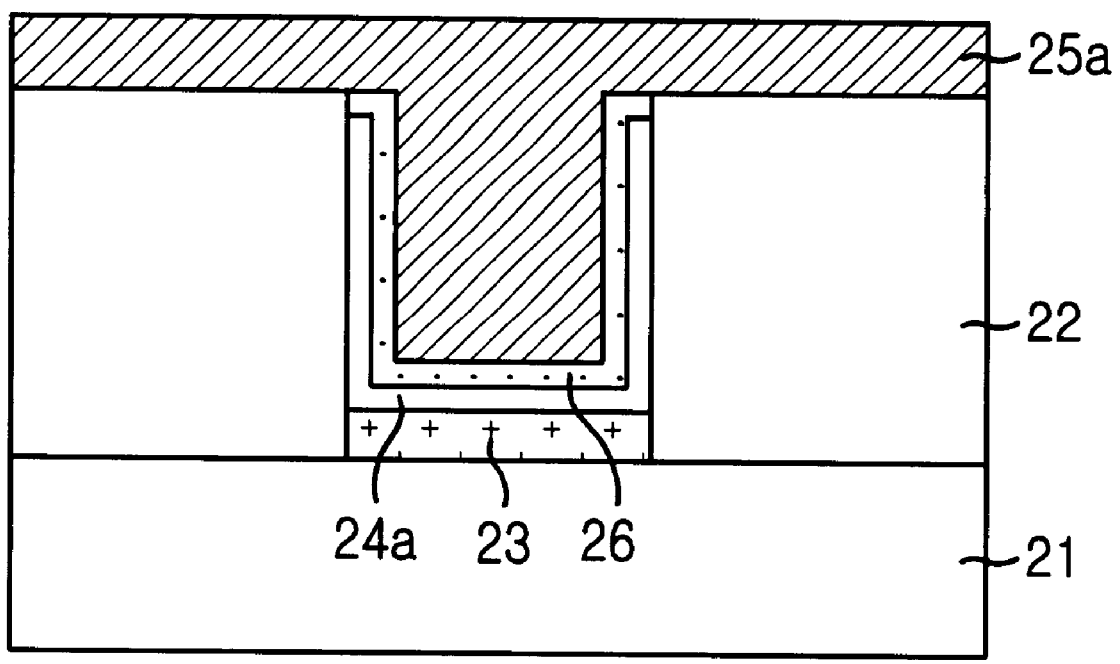

FIGS. 2A to 2C are cross-sectional views depicting a method for fabricating a capacitor in accordance with an aspect of the disclosure.

Referring to 2A, an interlayer dielectric layer 22 is deposited on a semiconductor substrate 21 having transistors and bit lines to insulate the substrate 21 from a capacitor to be formed subsequently, and then a storage node contact mask (not shown) is formed on the interlayer dielectric layer 22 by using a photoresist. The interlayer dielectric layer 22 is formed with an oxide layer to a thickness of about 5000 Å to about 20000 Å.

Subsequently, a storage node contact hole is formed to expose a predetermined part of the semiconductor substrate 11 by etching the interlayer dielectric layer 22 with the storage node contact mask. Here, the storage node contact hole can be formed in the shape of a circle, stick, rectangle or polygon.

Thereafter, a titanium layer is deposited on the entire surface including the storage node contact hole, and then after performing a rapid thermal process, an ohmic layer of titanium silicide ($TiSi_2$) is formed on the exposed semiconductor substrate 21 in the storage node contact hole to improve the contact resistance between the substrate 21 and a bottom electrode to be formed. The titanium layer is deposited by a method selected from the group consisting of sputtering, chemical vapor deposition (CVD) and atomic layer deposition (ALD) to form a layer having a thickness of about 100 Å to about 500 Å. The rapid thermal process (RTP) for forming the titanium silicide ($TiSi_2$) 23 is performed in an atmosphere of nitrogen or argon at a temperature of about 700° C. to about 900° C. for about 10 seconds to about 180 seconds. After that, any non-reacted titanium layer is removed by wet etching with either ammonium hydroxide or sulphuric acid. The wet-etching is carried out for about 1 minute to about 40 minutes. Meanwhile, after the deposition of titanium layer, an extra layer of titanium nitride (TiN) can be formed to a thickness of about 100 Å to about 500 Å by a method selected from the group consisting of sputtering, CVD and ALD.

After removing the non-reacted titanium layer, a $Ti_{1-x}Zr_xN$ layer 24 layer is formed by a method selected from the group consisting of sputtering, CVD and ALD, to a thickness of about 100 Å to about 300 Å. In case of depositing $Ti_{1-x}Zr_xN$ layer 24 by the CVD or ALD method, it can be deposited by gradually increasing the molar fraction of Zr from TiN to $Ti_{0.5}Zr_{0.5}N$. Namely, the molar fraction of Zr can be increased from 0 to 0.5 by controlling each flow rate of Ti and Zr.

Referring to FIG. 2B, the $Ti_{1-x}Zr_xN$ layer 24A is made to remain only in the storage node contact hole by removing the $Ti_{1-x}Zr_xN$ 24 on the interlayer dielectric layer 22. At this moment, a photo-resist layer or a spin on glass (SOG) layer is coated on the entire surface including $Ti_{1-x}Zr_xN$ layer 24, and the photo-resist layer or the SOG layer is selectively removed in order to leave the photo-resist layer or the SOG layer in the storage node contact hole only. After that, the $Ti_{1-x}Zr_x$ N layer 24 is etched back or polished chemically and/or mechanically, using the photo-resist or the SOG as an etch mask or an anti-polish layer until the surface of the interlayer dielectric layer 22 is exposed.

Subsequently, an electrode layer 25 is formed on the entire surface including the $Ti_{1-x}Zr_xN$ layer 24A, which remains in the storage node contact hole. The electrode layer 25 is formed of a noble metal such as, for example, platinum, iridium and ruthenium, and the electrode layer may be formed of a conductive oxide, or a complex layer of noble metal and a conductive oxide. The electrode layer 25 is deposited by a method selected from the group consisting of sputtering, CVD and ALD to a thickness of about 50 Å to about 2000 Å.

Examples of conductive oxides include $IrO_2$, $RuO_2$, $SrRuO_3$, $(Ba,Sr)RuO_3$, $(Sr,Ca)RuO_3$, $A_{1-x}Re_xB_zO_3$ ($0 \leq x \leq 0.5$, $0 \leq y \leq 0.5$, $0.9 \leq z \leq 1.1$, A=Y, La; Re=Sr, Ca; B=Cr, Mn, Fe) and $La_{1-x}Sr_xCo_{1-y}Cr_yO_3$ ($0 \leq x \leq 0.5$, $0 \leq y \leq 0.5$)

Referring to FIG. 2C, the substrate is typically thermally treated in an atmosphere of a gas mixture containing $O_2$ and one or more of $N_2$ and Ar at a temperature of about 400° C. to about 800° C. for about 10 seconds to about 10 minutes.

In a thermal treatment performed in an atmosphere containing oxygen gas, the $Ti_{1-x}Zr_xN$ 24A is oxidized, thus forming a $ZrO_2$ layer 26 to a thickness of about 50 Å to about 300 Å on the interface of the $Ti_{1-x}Zr_xN$ 24A and the electrode layer 25.

The non-reacted $Ti_{1-x}Zr_xN$ 24A that has not participated in the formation of $ZrO_2$ 26 is used as a bottom electrode 24B, the thermally treated electrode layer 25 is used as a top electrode 25A, and the $ZrO_2$ 26 is used as a dielectric layer of the capacitor.

As mentioned above, the $Ti_{1-x}Zr_xN$ 24A forms the $ZrO_2$ 26 and the bottom electrode 24B. So, the $Ti_{1-x}Zr_xN$ 24A, which is a storage node contact and anti-diffusion layer, is utilized as a bottom electrode 24B as well. Accordingly, the disclosure simplifies a capacitor fabrication process by using the anti-diffusion layer $Ti_{1-x}Zr_xN$ 24A as a bottom electrode 24B and forming a top electrode 25A on top of the $Ti_{1-x}Zr_xN$ 24A. That is, by forming only two layers, i.e., the $Ti_{1-x}Zr_xN$ 24 and the electrode layer 25, and performing a thermal treatment, it is possible to simplify the fabrication procedure, unlike the conventional technology that requires the formation of five layers, a titanium silicide/titanium nitride/bottom electrode/dielectric layer/top electrode in order.

If the $Ti_{1-x}Zr_xN$ 24 is exposed in the $O_2$-containing atmosphere without an electrode layer thereon, and is subsequently oxidized, the surface reacts with $O_2$ so it becomes rough. Also, because the surface does not receive any compressive stress from outside, the $Ti_{1-x}Zr_xN$ 24 becomes swollen during the oxidation and forms fine cracks, thus inhibiting the obtainment of a quality $ZrO_2$ as good as can be used for a dielectric layer.

Also, in case of forming $ZrO_2$ by the CVD or the ALD method, a high temperature thermal treatment is necessary to improve quality of the $ZrO_2$ layer, because the oxidation reaction occurs at a low temperature.

However, in one aspect of the disclosure, since the oxygen atoms (O) diffuse through the electrode layer 25 on the $Ti_{1-x}Zr_xN$ layer 24A and react with the $Ti_{1-x}Zr_xN$ 24A, the reaction time is very fast. Also, because the $Ti_{1-x}Zr_xN$ layer is covered with the electrode 25, the $Ti_{1-x}Zr_xN$ layer 24A receives compressive stress from it and the interface between the $ZrO_2$ and the electrode layer 25 is smooth.

Besides, with $ZrO_2$ formed through a thermal treatment, the lattice mismatch is relieved as much as possible, and the amount of surface charges that adversely affects leakage current is minimized.

Extra nitrogen atoms (N) generated while the $ZrO_2$ is formed go back into the $Ti_{1-x}Zr_xN$ 24A, so no voids are generated between the $ZrO_2$ 26 and the electric layer 25.

The capacitor formed in the above processes uses an electrode layer 25 as its top electrode 25A; non-reacted $Ti_{1-x}Zr_xN$ 24 as its bottom electrode 24A; and the reaction product $ZrO_2$ 26 as its dielectric layer. A desired thickness of the dielectric layer can be obtained by controlling the temperature and time of the thermal treatment.

The oxide layer generated during the oxidation of $Ti_{1-x}Zr_xN$ is not a $TiO_2$ layer but a $ZrO_2$ layer, which can be determined by a thermodynamic observation.

Figure 3:
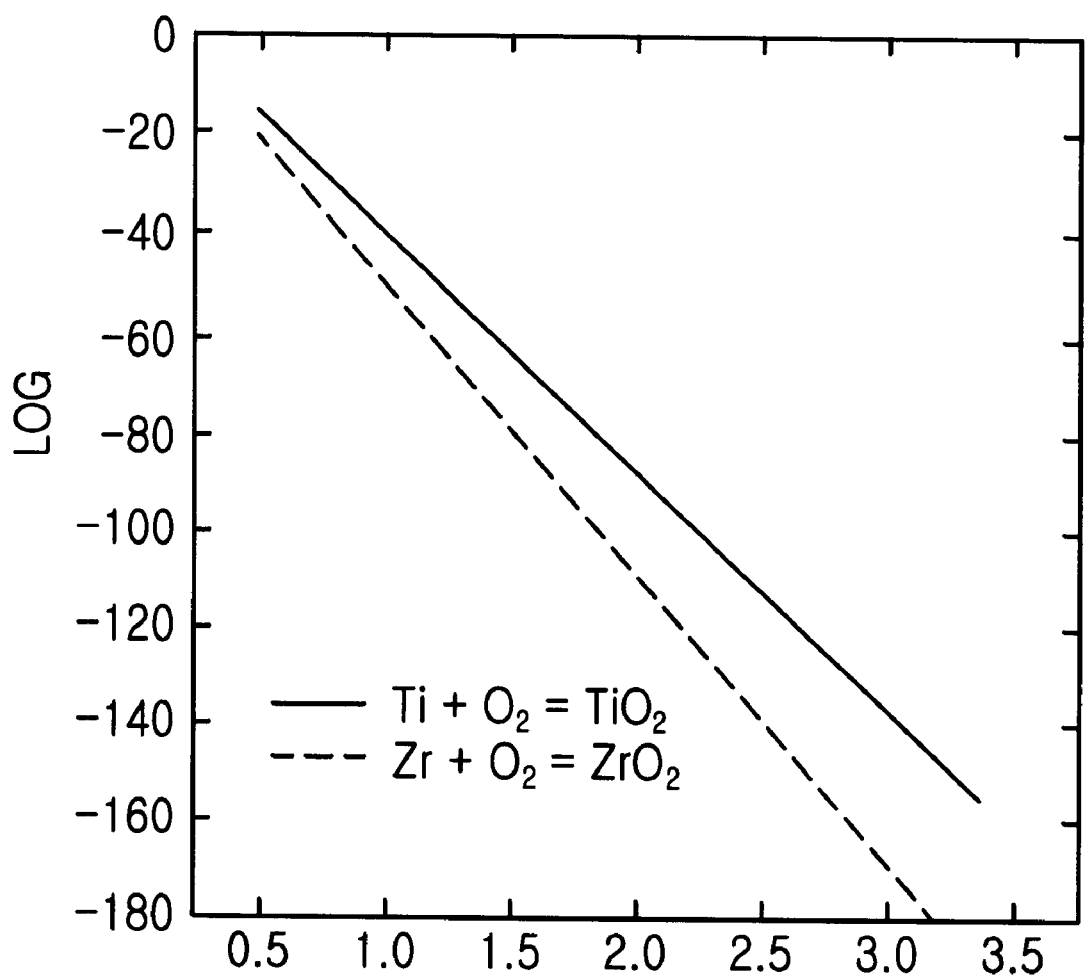
FIG. 3 is a graph showing a phase stability of $TiO_2$ and $ZrO_2$.

FIG. 3 is a graph showing a phase stability of $TiO_2$ and $ZrO_2$.

With reference to FIG. 3, since the balance pressure of oxygen ($P_{O2}$) in the present of $Zr/ZrO_2$ is lower than the balance pressure of oxygen ($P_{O2}$) in the present of $Ti/TiO_2$, $ZrO_2$ is more stable than $TiO_2$ thermodynamically. Accordingly, when Zr and Ti are mixed and thermally treated in the atmosphere of oxygen, Zr, which is less stable thermodynamically, is oxidized faster than Ti because the oxidation potential of Zr is bigger than that of Ti.

Likewise, in case $Ti_{1-x}Zr_xN$ is oxidized, $ZrO_2$ is more stable thermodynamically than $TiO_2$, which is formed on the surface.

The disclosed method does not require that a sacrificial oxide layer is formed for a bottom electrode, because the bottom electrode is directly formed in the storage node contact hole, thus facilitating the following processes easily by lowering the deposition height of a capacitor as well as keeping the alignment of depositions.

Also, a method in accordance with the disclosure can obtain high quality of $ZrO_2$ and low leakage current by a solid reaction method through a one-time thermal treatment with no need for a chemical vapor deposition device or an atomic layer deposition device to form the $ZrO_2$.

A method in accordance with the disclosure simplifies the fabrication process as well by forming a $ZrO_2$ layer, a bottom electrode, and a top electrode through a one-time thermal treatment after depositing a $Ti_{1-x}Zr_xN$ and a conductive layer successively.

While the disclosure has been described with respect to certain preferred embodiments, it will be apparent to those skilled in the art that various changes and modifications may be made without departing from the scope of the following claims.

What is claimed is:

1. A method for fabricating a capacitor, comprising the steps of:

forming a $Ti_{1-x}Zr_xN$ layer on a substrate, wherein x is in the range of 0 to 0.5, inclusive;

forming an electrode layer on the $Ti_{1-x}Zr_xN$ layer; and forming a $ZrO_2$ layer on an interface between the electrode layer and the $Ti_{1-x}Zr_xN$ layer by performing a thermal treatment in an atmosphere containing oxygen gas, whereby a capacitor including a bottom electrode formed with the $Ti_{1-x}Zr_xN$ layer, a dielectric layer formed with the $ZrO_2$ layer and a top electrode formed with the electrode layer is fabricated.

2. The method of claim 1, comprising forming the $ZrO_2$ layer to a thickness of about 50 Å to about 300 Å.

3. The method of claim 1, comprising performing the thermal treatment in an atmosphere of a gas mixture of oxygen and one or more of nitrogen and argon.

4. The method of claim 1, comprising performing the thermal treatment at a temperature of about 400° C. to about 800° C. for about 10 seconds to about 10 minutes.

5. The method of claim 1, comprising forming the $Ti_{1-x}Zr_xN$ layer by a method selected from the group consisting of sputtering, chemical vapor deposition (CVD), and atomic layer deposition (ALD).

6. The method of claim 1, comprising forming the $Ti_{1-x}Zr_xN$ layer to a thickness of about 100 Å to about 300 Å.

7. The method of claim 1, comprising forming the $Ti_{1-x}Zr_xN$ layer by a method selected from the group consisting of chemical vapor deposition (CVD) and atomic layer deposition (ALD) by increasing the molar fraction of Zr.

8. A method for fabricating a capacitor, comprising the steps of:

forming an interlayer dielectric layer on a silicon semiconductor substrate;

forming a contact hole that exposes a surface of the semiconductor substrate by selectively etching the interlayer dielectric layer;

forming a $Ti_{1-x}Zr_xN$ layer in the contact hole, wherein x is in the range of 0 to 0.5, inclusive;

forming an electrode layer on the $Ti_{1-x}Zr_xN$ layer; and forming a $ZrO_2$ layer on an interface between the electrode layer and the $Ti_{1-x}Zr_xN$ layer by performing a thermal treatment in an atmosphere containing oxygen gas, whereby a capacitor including a bottom electrode formed with the $Ti_{1-x}Zr_xN$ layer, a dielectric layer formed with the $ZrO_2$ layer, and a top electrode formed with the electrode layer is fabricated.

9. The method of claim 8, further comprising the step of forming an ohmic contact layer between the semiconductor layer and the $Ti_{1-x}Zr_xN$ layer.

10. The method of claim 8, comprising forming the $ZrO_2$ layer to a thickness of about 50 Å to about 300 Å.

11. The method of claim 8, comprising performing the thermal treatment in an atmosphere of a gas mixture of oxygen and one or more of nitrogen and argon.

12. The method of claim 8, comprising performing the thermal treatment at a temperature of about 400° C. to about 800° C. for about 10 seconds to about 10 minutes.

13. The method of claim 8, comprising forming the $Ti_{1-x}Zr_xN$ layer by a method selected from the group consisting of sputtering, chemical vapor deposition (CVD), and atomic layer deposition (ALD).

14. The method of claim 13, comprising forming the $Ti_{1-x}Zr_xN$ layer to a thickness of about 100 Å to about 300 Å.

15. The method of claim 8, comprising forming the $Ti_{1-x}Zr_xN$ layer by a method selected from the group consisting of chemical vapor deposition (CVD) and atomic layer deposition (ALD) by gradually increasing a molar fraction of Zr from TiN to $Ti_{0.5}Zr_{0.5}N$.

16. The method of claim 8, wherein forming the $Ti_{1-x}Zr_xN$ layer in the contact hole comprises the steps of:

forming an anti-polish layer or an etch mask on the $Ti_{1-x}Zr_xN$ layer in the contact hole; and applying a chemical mechanical polish to or performing an etch-back process on the $Ti_{1-x}Zr_xN$ layer until the surface of the interlayer dielectric layer is exposed.

17. The method of claim 16, wherein the anti-polish layer or the etch mask comprises photoresist or spin-on glass.

* * * * *